United States Patent
Yang

(10) Patent No.: US 9,018,695 B2
(45) Date of Patent: Apr. 28, 2015

(54) SEMICONDUCTOR DEVICE AND METHOD FOR MANUFACTURING THE SAME

(75) Inventor: Hee Jung Yang, Suwon (KR)

(73) Assignee: Hynix Semiconductor Inc., Icheon (KR)

( * ) Notice: Subject to any disclaimer, the term of this patent is extended or adjusted under 35 U.S.C. 154(b) by 548 days.

(21) Appl. No.: 12/981,364

(22) Filed: Dec. 29, 2010

(65) Prior Publication Data

US 2012/0119285 A1   May 17, 2012

(30) Foreign Application Priority Data

Nov. 15, 2010  (KR) .................. 10-2010-0113532

(51) Int. Cl.
 *H01L 29/78* (2006.01)
 *H01L 27/108* (2006.01)
 *H01L 29/423* (2006.01)
 *H01L 29/66* (2006.01)

(52) U.S. Cl.
 CPC ...... *H01L 27/10876* (2013.01); *H01L 29/4236* (2013.01); *H01L 29/42368* (2013.01); *H01L 29/66545* (2013.01); *H01L 29/66621* (2013.01); *H01L 29/66659* (2013.01)

(58) Field of Classification Search
 CPC ............... H01L 29/42356; H01L 29/4236; H01L 29/42364; H01L 29/12368; H01L 29/66621; H01L 29/66545; H01L 29/66659; H01L 29/66704

USPC .................... 257/329, 330, E29.255, E21.19, 257/E27.06, E27.084, E21.419
See application file for complete search history.

(56) References Cited

U.S. PATENT DOCUMENTS

| | | | |
|---|---|---|---|
| 2007/0132016 A1* | 6/2007 | Elwin | 257/330 |
| 2008/0290404 A1* | 11/2008 | Chun | 257/330 |

FOREIGN PATENT DOCUMENTS

| | | |
|---|---|---|
| KR | 10-1999-004948 A | 1/1999 |
| KR | 1020080102775 A | 11/2008 |
| KR | 10-2009-0052516 A | 5/2009 |

\* cited by examiner

*Primary Examiner* — Ermias Woldegeorgis

(57) ABSTRACT

A semiconductor device and a method for manufacturing the same are disclosed, which can form a gate electrode material only in a recess of a buried gate cell structure, improve a Gate Induced Drain Leakage (GIDL) of a gate electrode material and a junction (i.e., drain region), prevent the gate electrode material from overlapping with the junction (i.e., drain region), and adjust the depth of junction, thereby improving channel resistance. The method for manufacturing a semiconductor device includes forming a device isolation region defining an active region over a semiconductor substrate, burying a gate electrode material in the semiconductor substrate, forming a gate electrode pattern by etching the gate electrode material, wherein the gate electrode pattern is formed at sidewalls of the active region including a source region, and forming a capping layer in the exposed active region.

11 Claims, 13 Drawing Sheets

SEMICONDUCTOR DEVICE AND METHOD FOR MANUFACTURING THE SAME

CROSS-REFERENCE TO RELATED APPLICATION

The priority of Korean patent application No. 10-2010-0113532 filed on 15 Nov. 2010, the disclosure of which is hereby incorporated in its entirety by reference, is claimed.

BACKGROUND OF THE INVENTION

Embodiments of the present invention relate to a semiconductor device and a method for manufacturing the same, which can form a gate electrode material only in a recess of a buried gate cell structure, improve a Gate Induced Drain Leakage (GIDL) of a gate electrode material and a junction (i.e., drain region), prevent the gate electrode material from overlapping with the junction (i.e., drain region), and adjust the depth of junction, thereby improving channel resistance.

A semiconductor memory device includes a plurality of unit cells each having a capacitor and a transistor. The capacitor is used to temporarily store data, and the transistor is used to transfer data between a bit line and the capacitor in response to a control signal (word line). The data transfer occurs using a semiconductor property where electrical conductivity changes depending on the environment. The transistor has three regions, i.e., a gate, a source, and a drain. Electric charges are moved between the source and the drain according to a control signal inputted to the gate of the transistor. The movement of the electric charges between the source and the drain is achieved through a channel region.

In the case where a general transistor is formed on a semiconductor substrate, a method of forming a gate on the semiconductor substrate and doping impurities into both sides of the gate so as to form a source and a drain has been used. As the data storage capacity of a semiconductor memory device increases and the feature width thereof decreases, the size of each unit cell has been gradually decreased. That is, the design rule of the capacitor and the transistor included in the unit cell has been reduced. Thus, as the channel length of a cell transistor is gradually decreased, the short channel effect, Drain Induced Barrier Lower (DIBL), etc. occur in the general transistor thus decreasing operational reliability. By maintaining a threshold voltage such that the cell transistor performs a normal operation, it is possible to solve the phenomena generated by decreased channel length. In general, as the channel of the transistor shortens, the concentration of the impurities doped into a region in which the channel is formed has been increased.

However, if the concentration of the impurities doped into the channel region is increased when the design rule is reduced to 100 nm or less, the electric field of a Storage Node (SN) junction increases, thereby lowering the refresh characteristics of a semiconductor memory device. In order to solve this problem, a cell transistor with a three-dimensional channel structure in which a channel extends in a vertical direction is used such that a relatively long channel length of the cell transistor is maintained even when the design rule is decreased. That is, even when a channel width of a horizontal direction is short, the channel length along a vertical direction is relatively long. Thus, impurity doping concentration may be reduced and deterioration of refresh characteristics can be prevented.

In addition, as the integration degree of the semiconductor device is increased, the distance between a word line coupled to a cell transistor and a bit line coupled to the cell transistor is gradually reduced. As a result, there may arise the shortcoming that parasitic capacitance is increased such that an operation margin of a sense amplifier (sense-amp) that amplifies data transmitted via the bit line is deteriorated, resulting in a negative influence upon operation reliability of the semiconductor device. In order to solve the above-mentioned shortcoming, burying the word line structure such that a word line is formed only in a recess instead of an upper part of the semiconductor substrate has been recently proposed to reduce parasitic capacitance between a bit line and a word line. The buried word line structure forms a conductive material in a recess formed in a semiconductor substrate, and covers an upper part of the conductive material with an insulation film such that the word line is buried in a semiconductor substrate. As a result, the buried word line structure can be electrically isolated from a bit line formed over a semiconductor substrate, including source/drain regions.

However, the buried word line (buried gate) structure has some disadvantages. First, a leakage current caused by a Gate Induced Drain Leakage (GIDL) of a semiconductor device increases between a conductive material (gate electrode) and either an N-type junction or a storage node contact of an active region. Second, refresh characteristics of the whole semiconductor device deteriorate due to the deteriorated GIDL characteristics. In order to substantially prevent an increase in the leakage current caused by such GIDL characteristics, large amounts of conductive material (gate electrode) of the buried word line (buried gate) are etched so that an overlap region between the storage node contact and the conductive material (gate electrode) can be minimized. However, assuming that large amounts of the conductive material (gate electrode) of such a buried word line (buried gate) are etched, the etched conductive material unavoidably increases the resistance of the buried word line (buried gate). Although this can prevent a leakage current caused by GIDL characteristics increasing, it also lowers the speed of the semiconductor device.

FIGS. 1A to 1D are cross-sectional views illustrating a semiconductor device and a method for manufacturing the same according to the conventional art.

Referring to FIGS. 1A and 1B, a pad insulation film (hard mask layer), that is composed of a pad oxide film 110 and a pad nitride film 120, is deposited over a semiconductor substrate 100. Then, a photoresist film (not shown) is deposited and an exposure process is then performed using a mask defining an active region 140. Thereafter, a Spin On Dielectric (SOD) material is buried in a trench 130, which is formed by etching both the exposed pad insulation film and the semiconductor substrate 100, and a planarization etching method, such as a Chemical Mechanical Polishing (CMP) method, is performed until the pad insulation film is exposed, so that a device isolation region 150 defining the active region 140 is formed.

Referring to FIG. 1C, after forming the device isolation region 150, N-type impurities are ion-implanted into the active region 140. After that, a photoresist film (not shown) is formed over the active region 140 and the device isolation region 150, and an exposure process is performed using a mask defining the buried gate, such that an insulation film and a hard mask layer are patterned. Thereafter, the active region 110 and the device isolation region 150 are etched using the patterned hard mask layer as an etch mask, so that a gate region 160 is formed. Preferably, the etch process for forming the gate region 160 may be anisotropically achieved.

Referring to FIG. 1D, a gate oxide film 170 is formed over the gate region 160. A gate electrode material (not shown) is buried in the gate region 160 including the gate oxide film 170, such that the recess gate 180 or the buried gate is completed. Under this structure, a GIDL may be caused due to the overlap between the recess gate 180 and the junction.

BRIEF SUMMARY OF THE INVENTION

Various embodiments of the present invention are directed to providing a semiconductor device and a method for manufacturing the same that substantially obviate one or more of the problems that result from limitations and disadvantages of the related art.

An object of the present invention is to provide a semiconductor device and a method for manufacturing the same, which can form a gate electrode material only in a recess of a buried gate cell structure, improve a Gate Induced Drain Leakage (GIDL) of a gate electrode material and a junction (i.e., drain region), prevent the gate electrode material from overlapping with the junction (i.e., drain region), and adjust the depth of junction, thereby improving channel resistance.

To achieve these objects and other advantages and in accordance with the purpose of the invention as embodied and broadly described herein, a method for manufacturing a semiconductor device includes forming a device isolation region that defines an active region over a semiconductor substrate; burying a gate electrode material in the semiconductor substrate; forming a gate electrode pattern by etching the gate electrode material, wherein the gate electrode pattern is formed at sidewalls of the active region, which includes a source region; and forming a capping layer in the exposed active region.

The active region may include an active region coupled to a bit line contact and an active region coupled to a storage node contact.

The burying of the gate electrode material may include etching the semiconductor substrate using a gate mask, forming a gate oxide film over the etched semiconductor substrate, and depositing the gate electrode material over the gate oxide film.

The etching of the semiconductor substrate may use an anisotropic etching process.

In the etching of the gate electrode material, the gate electrode material may be etched back.

The method may further include, after etching back the gate electrode material, anisotropically etching the lowermost part of the gate electrode material.

The gate electrode material may include at least one of aluminum (Al), tungsten (W), tungsten nitride (WN), titanium (Ti), and titanium nitride (TiN).

The forming of the gate electrode pattern includes forming a mask over the active region and the device isolation region and etching the gate electrode material using the mask. In this case, the mask may shield the active region coupled to the bit line contact, some parts of the gate electrode material, and a device isolation film.

The capping layer may include an oxide film, a nitride film, or a polymer.

After performing the gate electrode pattern, the method may further include anisotropically etching a lower part of the gate electrode material.

In accordance with another aspect of the present invention, a method for manufacturing a semiconductor device includes forming a device isolation region defining an active region over a semiconductor substrate; burying first and second gate electrode materials in the semiconductor substrate; forming a gate electrode pattern by etching the second gate electrode material wherein the gate electrode pattern is formed at sidewalls of the active region, which includes a source region; removing the first gate electrode material; and forming a capping layer in the exposed active region.

The burying of the first and second gate electrode materials may include etching the semiconductor substrate using a gate mask, forming a gate oxide film over the etched semiconductor substrate, and depositing the first gate electrode material and the second gate electrode material over the gate oxide film.

In accordance with still another aspect of the present invention, a semiconductor device includes a device isolation region for defining an active region over a semiconductor substrate; a gate region contained in the active region and the device isolation region; and a gate pattern contained in the gate region, wherein a gate electrode material of the gate pattern is formed at sidewalls of the active region, which includes a source region.

The semiconductor device may further include a capping layer or a polymer contained in the gate region.

The capping layer may include an oxide film or a nitride film.

The gate electrode material may include at least one of aluminum (Al), tungsten (W), tungsten nitride (WN), titanium (Ti), and titanium nitride (TiN).

The active region may include an active region coupled to a bit line contact and an active region coupled to a storage node contact.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the accompanying drawings. It should be understood that embodiments of the present invention can use recess gates or buried gates.

FIGS. 2A to 2F are cross-sectional views illustrating a semiconductor device and a method for manufacturing the same according to an embodiment of the present invention.

Figure 1A:
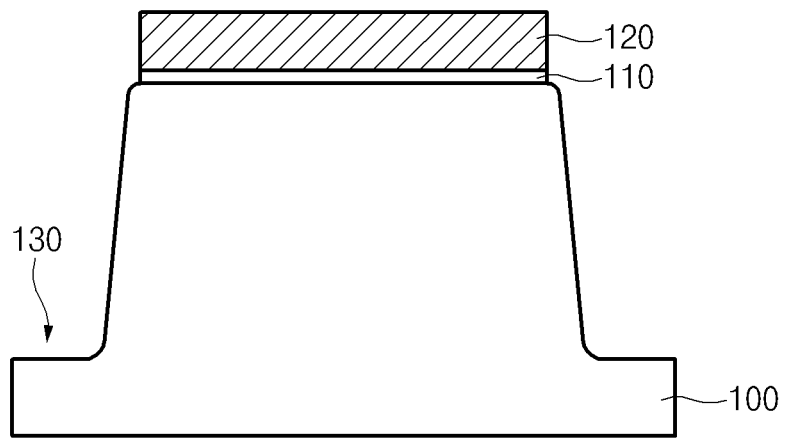
FIGS. 1A to 1D are cross-sectional views illustrating a semiconductor device and a method for manufacturing the same according to the related art.
Figure 1B:
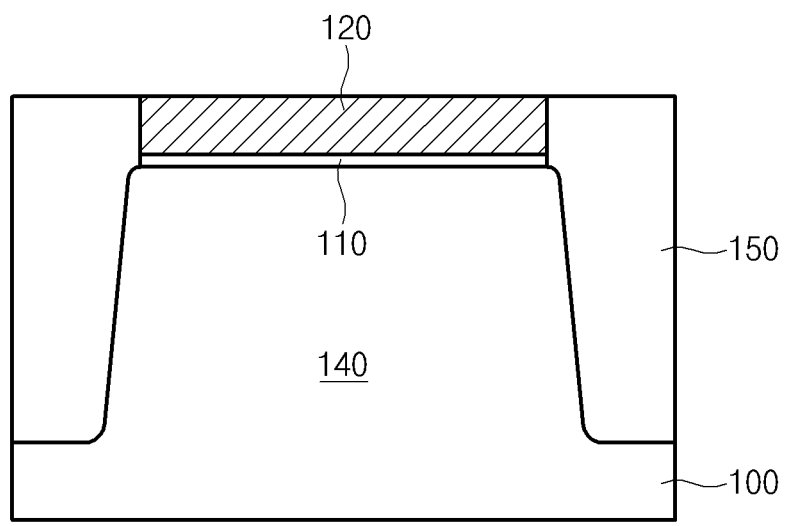
Figure 1C:
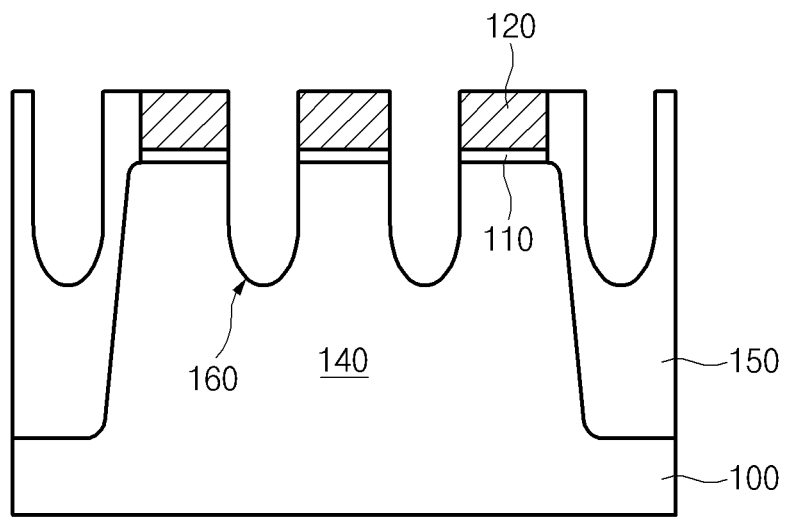
Figure 1D:
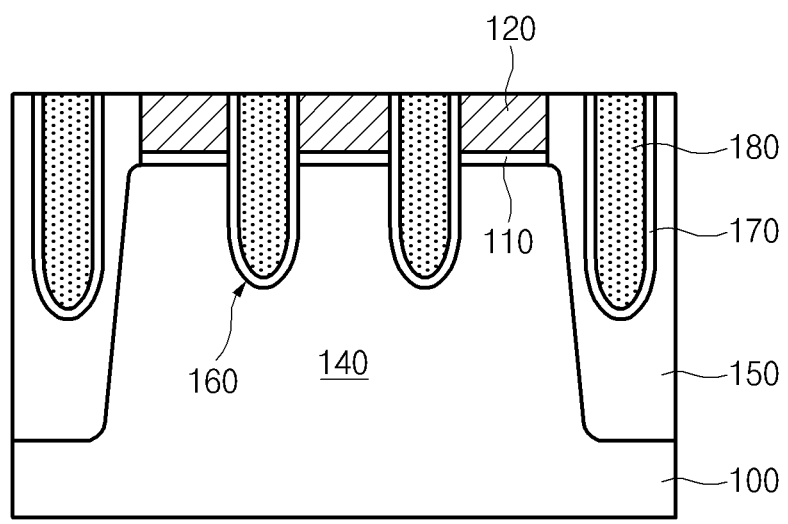
Figure 2A:
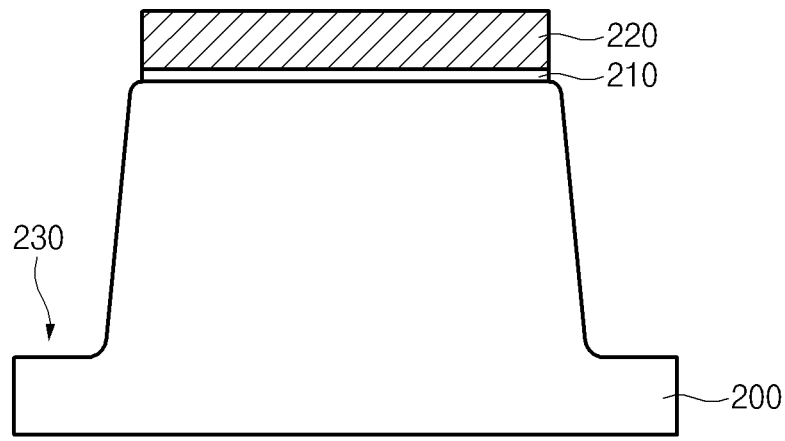
FIGS. 2A to 2F are cross-sectional views illustrating a semiconductor device and a method for manufacturing the same according to an embodiment of the present invention.
Figure 2B:
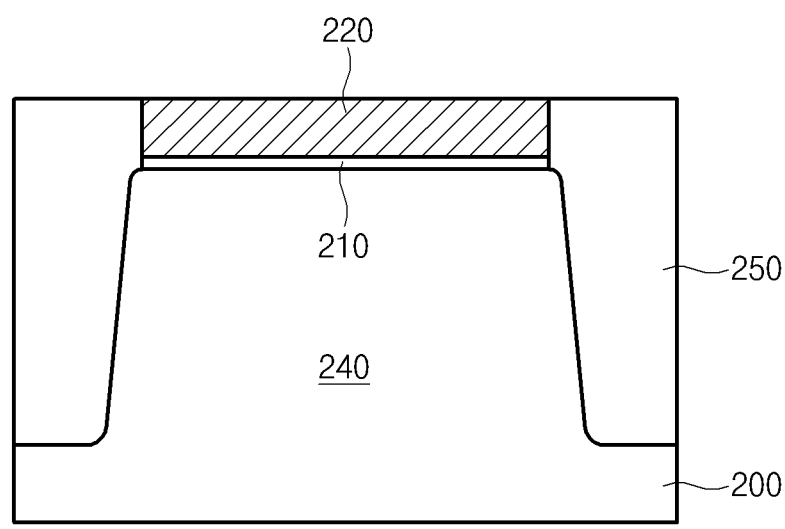

Referring to FIGS. 2A and 2B, a pad insulation film (hard mask layer), which is composed of, for example, a pad oxide film 210 and a pad nitride film 220, is deposited over a semiconductor substrate 200. Then, a photoresist film (not shown) is deposited and an exposure process is then performed using a mask defining an active region 240. Thereafter, a Spin On Dielectric (SOD) material fills in a trench 230 formed by etching both the exposed pad insulation film and the semiconductor substrate 200, and a planarization etching method such as a Chemical Mechanical Polishing (CMP) method is performed until the pad insulation film is exposed, so that a device isolation region 250 defining the active region 240 is completed.

Figure 2C:
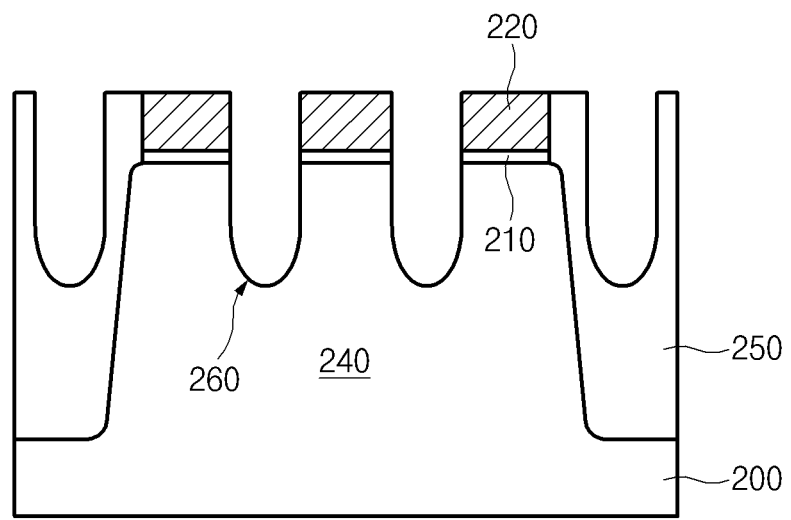

Referring to FIG. 2C, after forming the device isolation region 250, N-type impurities are ion-implanted into the active region 240, so that a source/drain junction is formed. After that, a photoresist film (not shown) is formed over the active region 240 and the device isolation region 250, and an exposure process is performed using a mask that defines a buried gate or a recess gate, such that an insulation film and a hard mask layer are patterned. Thereafter, the active region 240 and the device isolation region 250 are etched using the patterned insulation film or the patterned hard mask layer as an etch mask, so that a gate region 260 is formed. Preferably, the etch process for forming the gate region 260 may be anisotropically achieved.

Figure 2D:
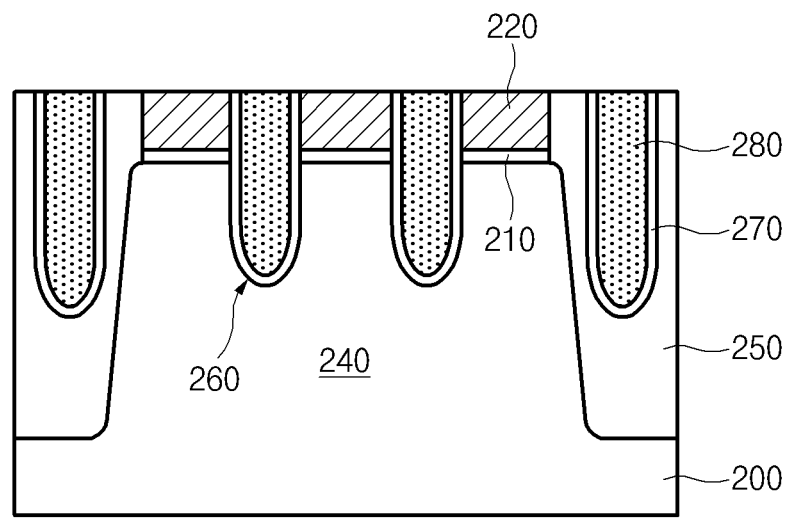

Referring to FIG. 2D, an oxidation process is performed on the gate region 260 such that a gate oxide film 270 is formed.

A gate electrode material (not shown) fills in the gate region 260, including the gate oxide film 270, so that the recess gate or the buried gate 280 is completed. In this case, it is preferable that the gate electrode material include aluminum (Al), tungsten (W), tungsten nitride (WN), titanium (Ti), titanium nitride (TiN), or a laminated structure of TiN and W.

Figure 2E:
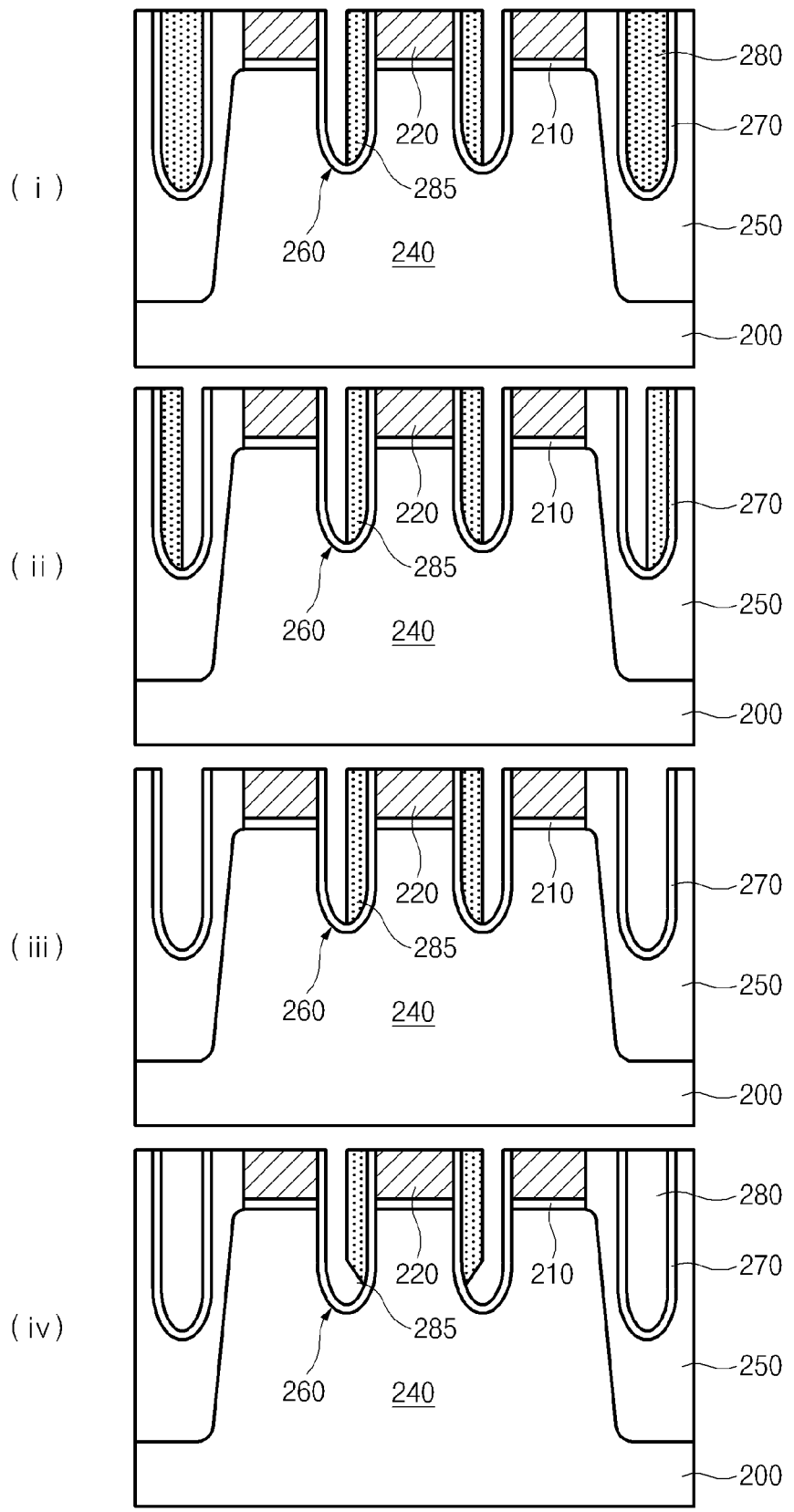

Referring to FIG. 2E(i), after a photoresist film is formed over the pad nitride film 220, the device isolation region 250, the gate oxide film 270 and the buried gate 280, an exposure and development process is performed using a mask that shields a pad insulation film, a device isolation film of an upper part of the active region, and a part of the buried gate 280, thereby forming a photoresist pattern (not shown). Preferably, the mask shields half of the buried gate 280. After that, the gate electrode material of the buried gate 280 is etched using the photoresist film pattern as an etch mask, so that a buried gate electrode pattern 285 is formed. Referring to FIG. 2E(iv), a lower part of the buried gate electrode pattern 285 may be anisotropically etched. The lowermost part of the buried gate electrode pattern 285 minimizes a contact region directed to the drain region, such that Gate Induced Drain Leakage (GIDL) between the buried gate electrode pattern 285 and the junction can be decreased. Preferably, when an electrode material of the buried gate in the active region 240 is etched, a gate electrode material in the device isolation region 250 may also be etched. In this case, referring to FIGS. 2E(ii) and 2E(iii), not only the buried gate 280 of the active region 240 but also the buried gate 280 of the device isolation region 250 may be partially or fully etched using different masks. For reference, it is preferable that the formation methods shown in FIGS. 2E(i), 2E(ii) and 2E(iii) be performed by etching the gate electrode material using the masks shown in FIGS. 4, 5, and 6 as etch masks, respectively.

Figure 2F:
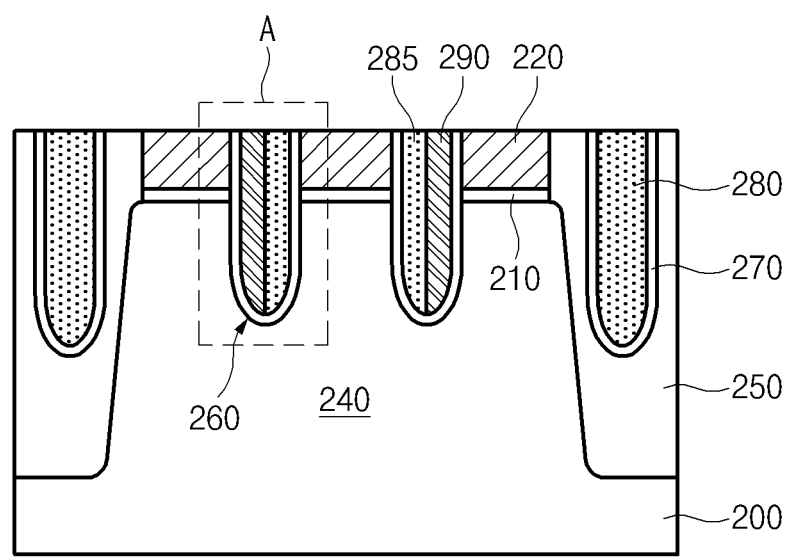

Referring to FIG. 2F, a capping layer 290 is formed in a space formed when the gate electrode material of the gate region 260 is etched. It is preferable that the capping layer include an oxide film or a nitride film. In this case, the capping layer 290 is formed over the entire surface including the gate region 260, and is then etched using a planarization etching method, such as a Chemical Mechanical Polishing (CMP) method, until the pad nitride film 220 is exposed. In this case, the gate electrode pattern 285 and the junction (drain region) are not overlapped with each other, so that the depth for forming the junction may be adjusted and the amount of GIDL may be reduced.

After the capping layer 290 is first buried in the gate region 260, the capping layer 290 in the active region 240 adjacent to a source region is removed. A gate electrode material is provided underneath the removed capping layer 290 to implement an embodiment of the present invention.

FIGS. 3A to 3H are cross-sectional views illustrating a semiconductor device and a method for manufacturing the same according to an embodiment of the present invention.

Figure 3A:
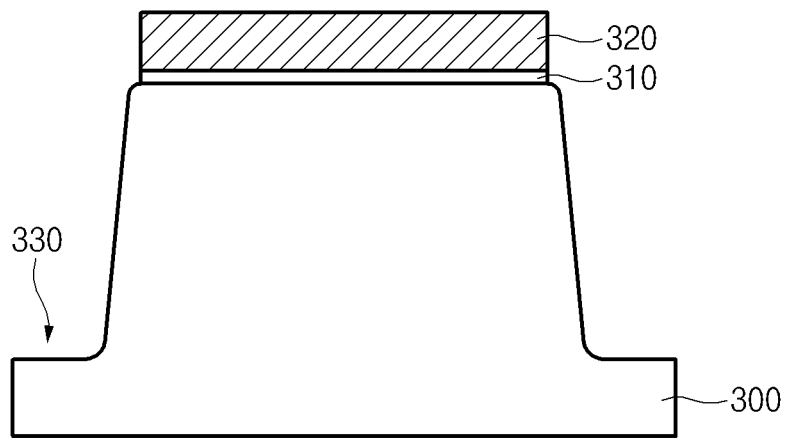
FIGS. 3A to 3H are cross-sectional views illustrating a semiconductor device and a method for manufacturing the same according to an embodiment of the present invention.
Figure 3B:
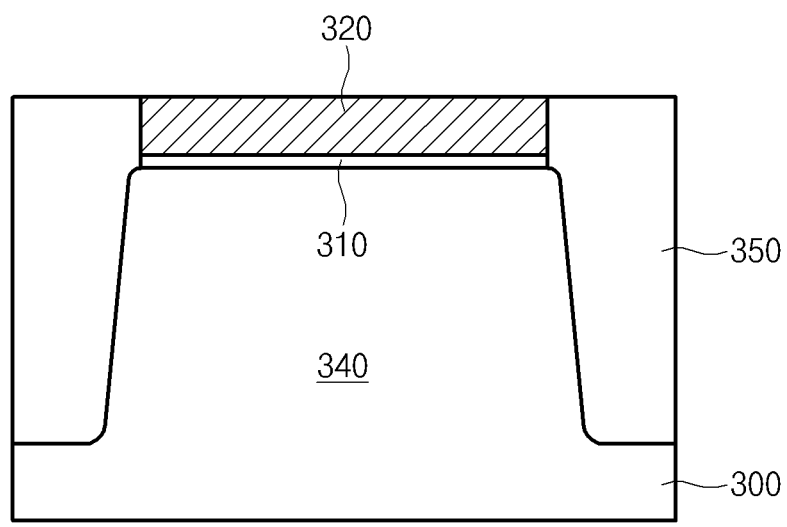

Referring to FIGS. 3A and 3B, a pad insulation film (hard mask layer), which may be composed of, for example, a pad oxide film 310 and a pad nitride film 320, is deposited over a semiconductor substrate 300. Then, a photoresist film (not shown) is deposited and an exposure process is then performed using a mask defining an active region 340. Thereafter, a Spin On Dielectric (SOD) material is buried in a trench 330 formed by etching both the exposed pad insulation film and the semiconductor substrate 300, and a planarization etching method such as a Chemical Mechanical Polishing (CMP) method is performed until the pad insulation film is exposed, so that a device isolation region 350 defining the active region 340 is completed.

Figure 3C:
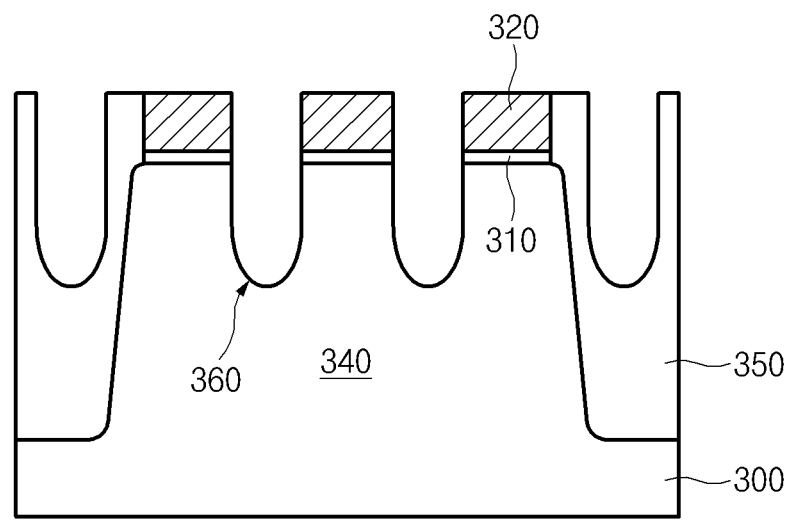

Referring to FIG. 3C, after forming the device isolation region 350, N-type impurities are ion-implanted into the active region 340, so that a source/drain junction is formed. After that, a photoresist film (not shown) is formed over the active region 340 and the device isolation region 350, and an exposure process is performed using a mask that defines a buried gate, such that an insulation film and a hard mask layer are patterned. Thereafter, the active region 340 and the device isolation region 350 are etched using the patterned insulation film or the patterned hard mask layer as an etch mask, so that a gate region 360 is formed. Preferably, the etch process for forming the gate region 360 may be anisotropically achieved.

Figure 3D:
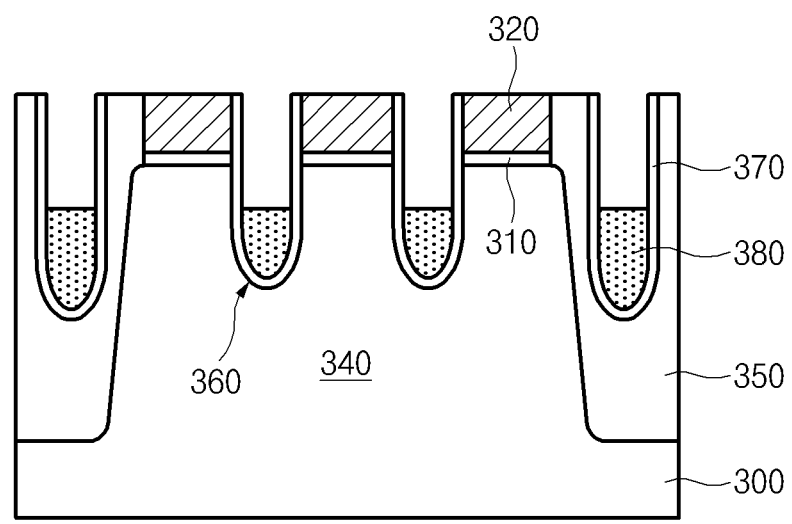

Referring to FIG. 3D, the gate oxide film 370 is formed over the gate region 360. In this case, it is preferable that the gate oxide film 370 may use a oxidation process or method for depositing an oxide film.

The gate electrode material 380 fills in a lower portion of the gate region 360 including the gate oxide film 370. In this case, it is preferable that a first gate electrode material 380 may include a polymer.

Figure 3E:
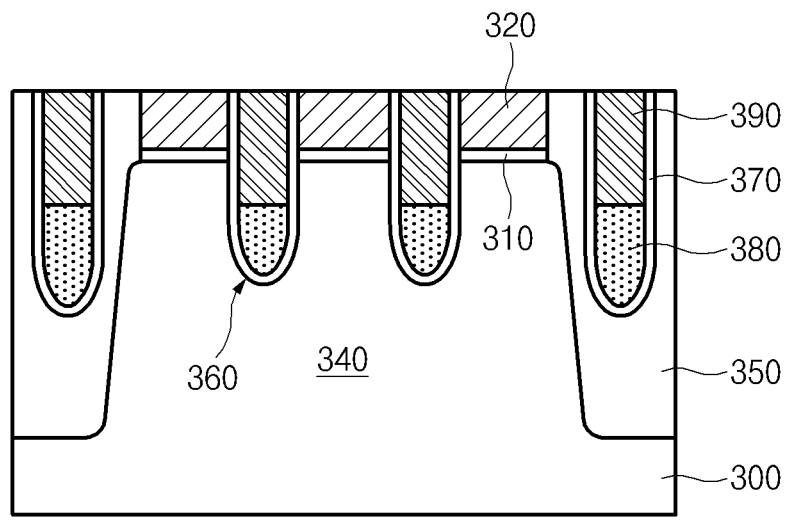

Referring to FIG. 3E, a second gate electrode material 390 is formed over the first gate electrode material 380 in the gate region 360. Preferably, the second gate electrode material may include at least one of aluminum (Al), tungsten (W), tungsten nitride (WN), titanium (Ti), and titanium nitride (TiN).

Figure 3F:
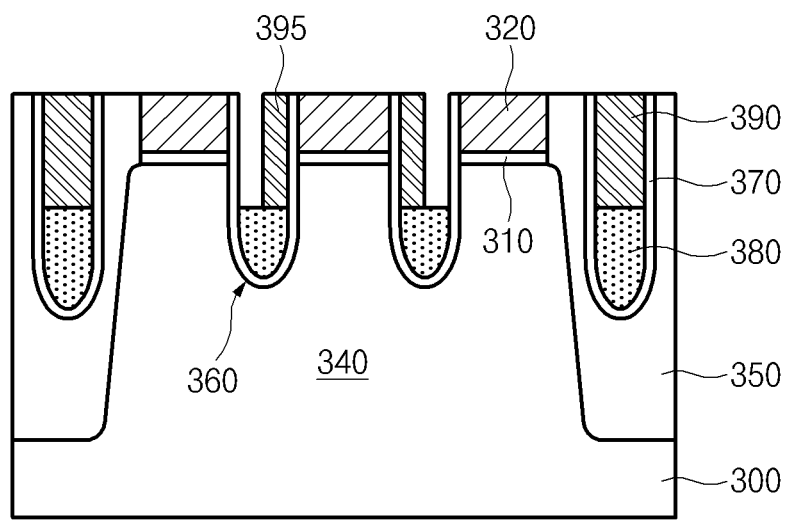

Referring to FIG. 3F, after a photoresist film is formed over the pad nitride film 320 and the second gate electrode material 390, an exposure and development process is performed using a mask that shields a pad insulation film, a device isolation film of an upper part of the active region, and a part of the second gate electrode material 390, thereby forming a photoresist film (not shown). After that, the second gate electrode material 390 is etched using the photoresist film pattern as an etch mask until the first gate electrode material 380 is exposed, so that a buried gate electrode pattern 395 is formed. When the second gate electrode material is etched, it is preferable that a gate electrode material neighboring the junction region (drain region) be etched.

Figure 3G:
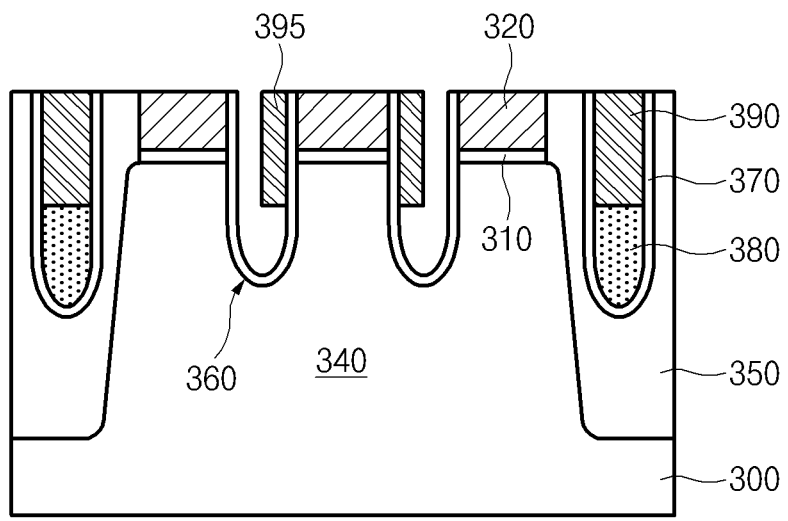

Referring to FIG. 3G, the first gate electrode material 380 is removed using an etchant with a different etch selection ratio than the gate electrode pattern 395 and than the first gate electrode material 380. In this case, the first gate electrode material 380 is formed of a polymer, and the gate electrode pattern 395 is formed of a metal material, so that the first gate electrode material 380 can be removed using etch methods with different etch selection ratios between the gate electrode pattern 395 and the first gate electrode material 380.

Figure 3H:
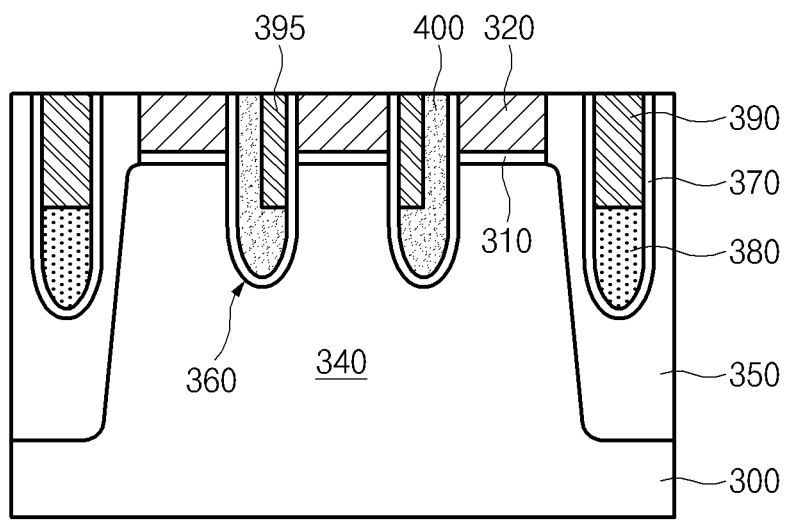

Referring to FIG. 3H, the capping layer 400 is formed in a space in which the first gate electrode material 380 is etched. In this case, it is preferable that the capping layer 400 include an oxide film or a nitride film. In this case, the capping layer 400 is formed over the entire surface including the gate region 360, and is then etched using a planarization etching method such as a Chemical Mechanical Polishing (CMP) method until the pad nitride film 320 is exposed. In this case, the gate electrode pattern 395 and the junction (drain region) do not overlap, so that the depth for forming the junction may be adjusted and GIDL may be sufficiently reduced. In addition, it is possible to form the junction without being affected by an electrode material constructing a recess or a buried gate.

Figure 4:
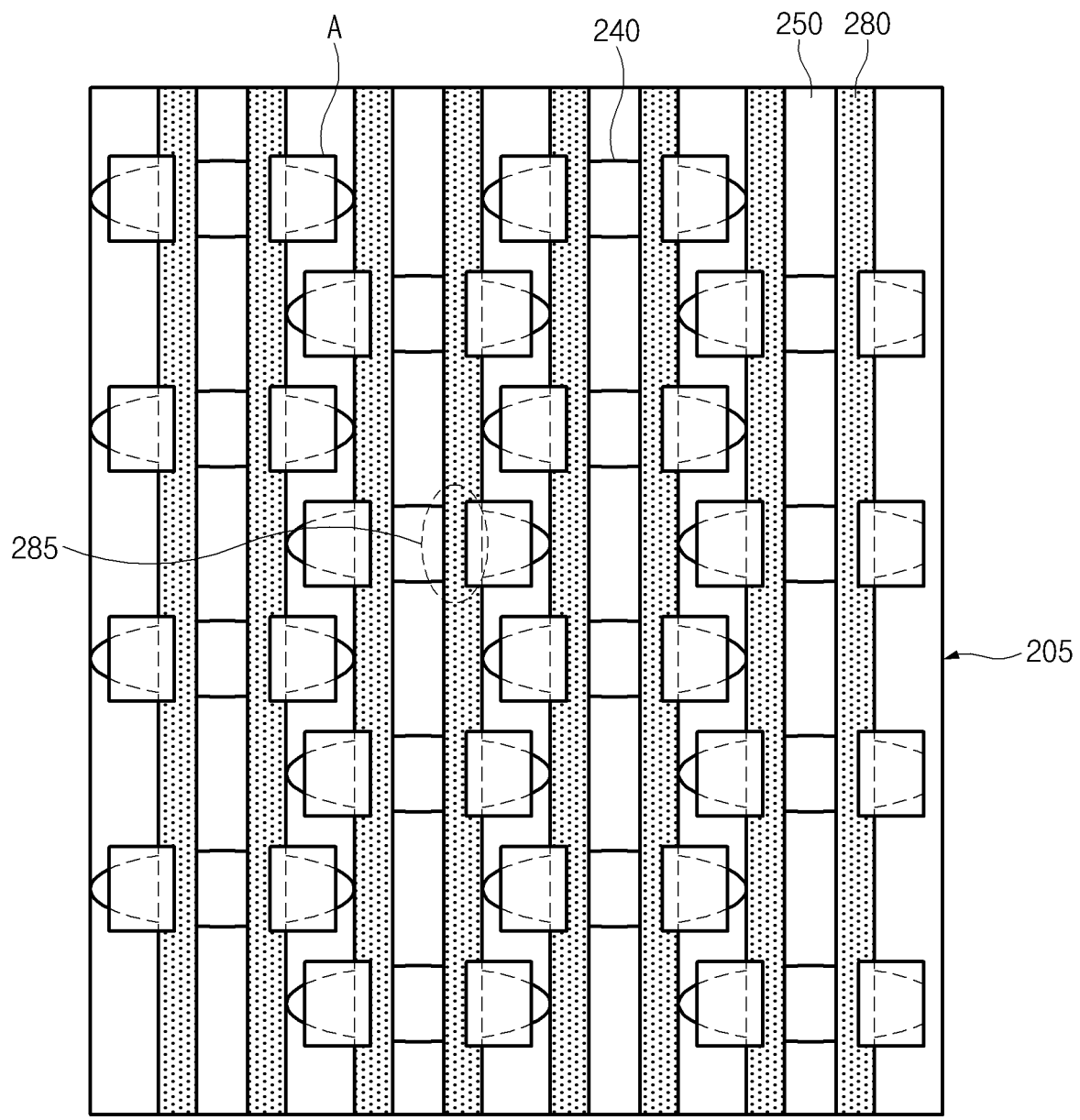
FIG. 4 shows a semiconductor device and a method for manufacturing the same according to a first embodiment of the present invention.
Figure 5:
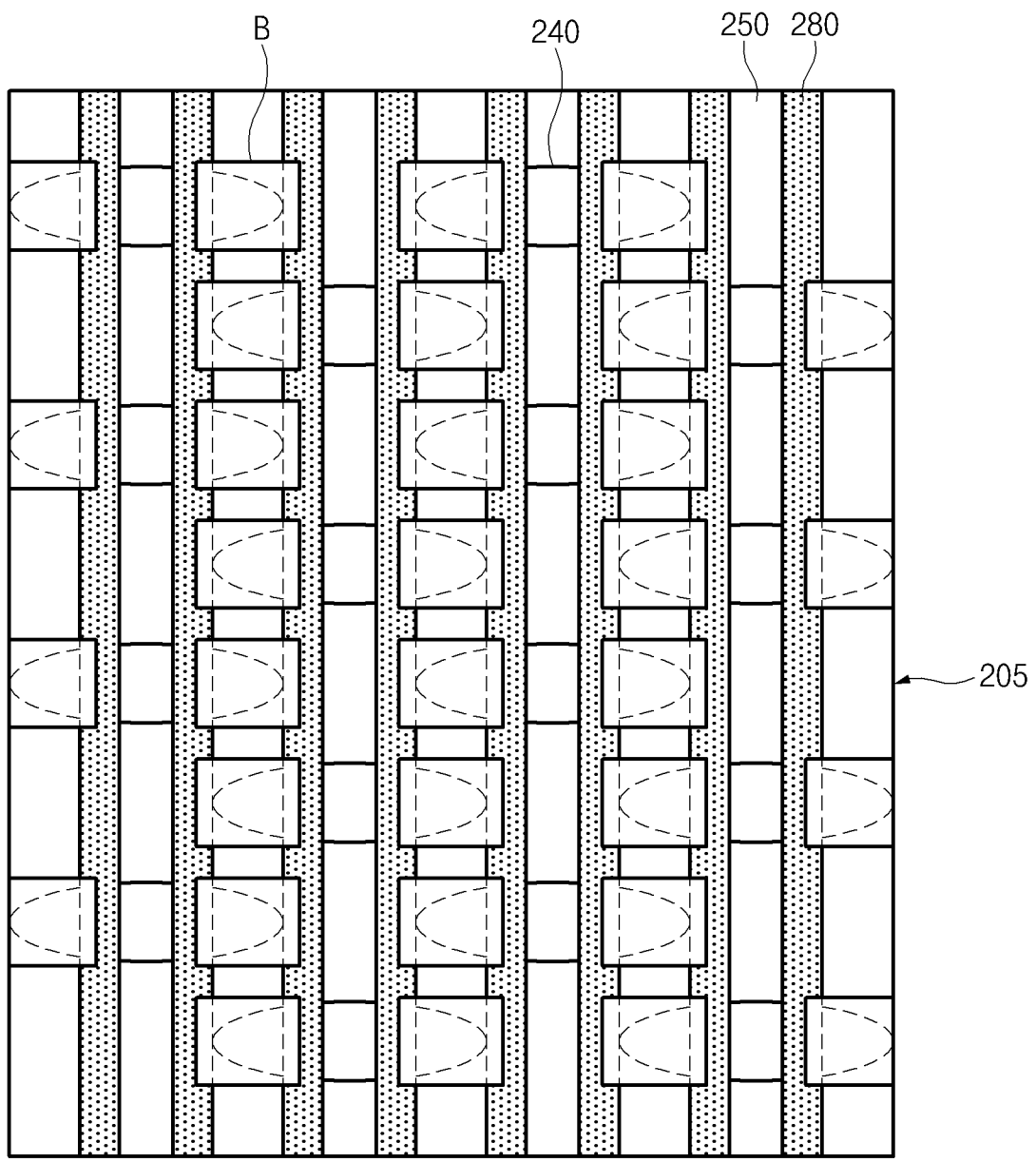
FIG. 5 shows a semiconductor device and a method for manufacturing the same according to a second embodiment of the present invention.
Figure 6:
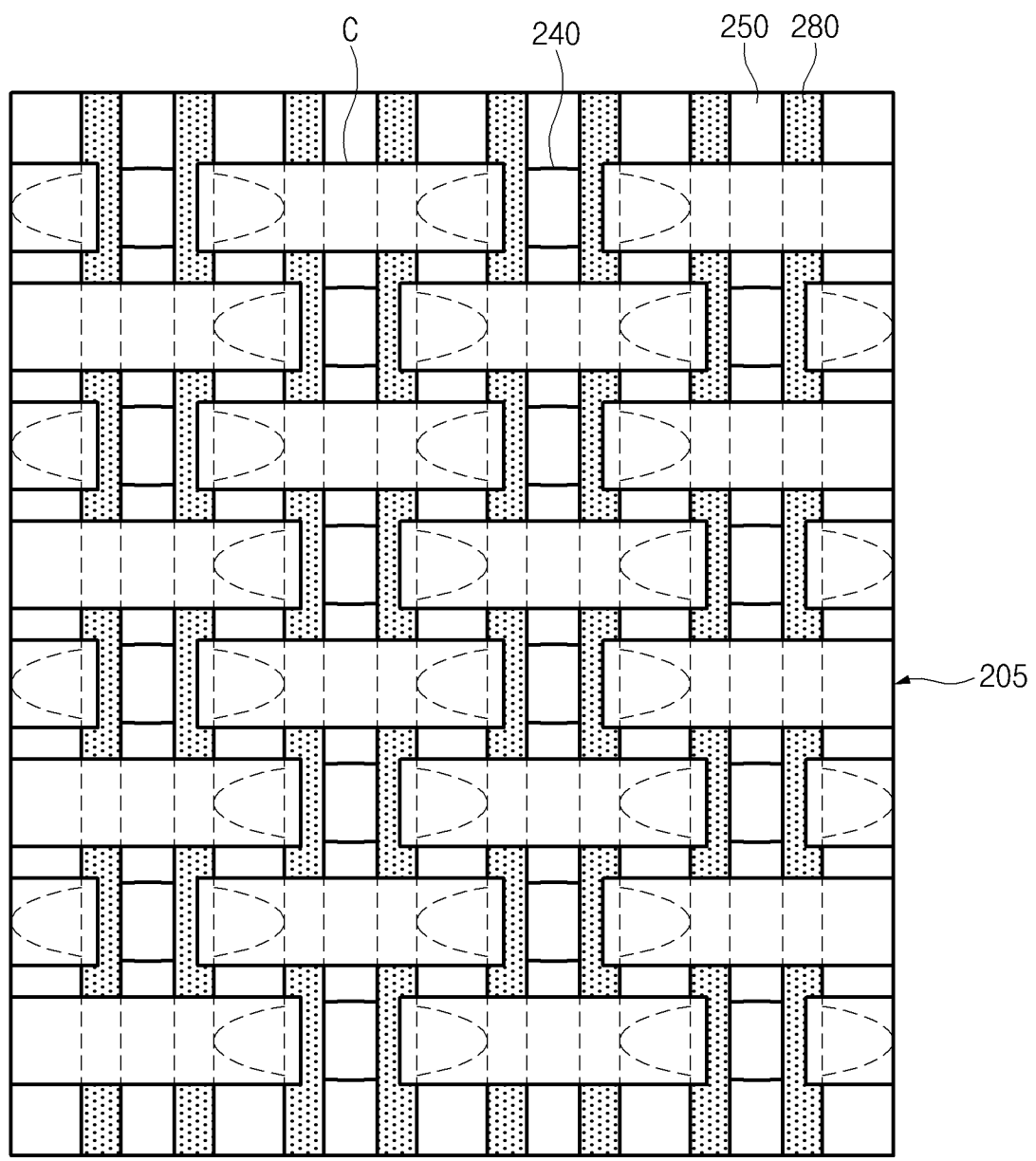
FIG. 6 shows a semiconductor device and a method for manufacturing the same according to a third embodiment of the present invention.

FIG. 4 shows a semiconductor device and a method for manufacturing the same according to a first embodiment of the present invention. FIG. 5 shows a semiconductor device and a method for manufacturing the same according to a second embodiment of the present invention. FIG. 6 shows a semiconductor device and a method for manufacturing the same according to a third embodiment of the present invention. In more detail, FIGS. 4 to 6 show masks used for a semiconductor device and a method for manufacturing the semiconductor device according to the present invention. The gate electrode pattern 285 may be configured in different forms depending on the masks used as an etch mask.

Referring to FIG. 4, upon completion of the fabrication of FIG. 2D, the gate electrode material is etched using the mask of FIG. 4 as an etch mask, so that the gate electrode pattern 285 is formed as shown in FIG. 2E(i). In this case, light passes through the photoresist (not shown) over a part of the gate electrode material 280 neighboring the drain region of the active region 240 (See the region A). The regions other than the region A are covered by a mask 205, and the gate electrode pattern 285 is formed only at inner sidewalls of the gate region 260 shown in FIG. 2E in such a manner that the gate electrode pattern 285 contacts a source region. The gate electrode pattern 285 and the junction (drain region) are not overlapped with each other, so that the depth for forming the junction may be adjusted and GIDL may be reduced.

Referring to FIG. 5, upon completion of the process of FIG. 2D, the gate electrode material is etched using the mask 205 of FIG. 5 as an etch mask, so that the gate electrode pattern 285 is formed as shown in FIG. 2E(ii). In this case, the gate electrode materials of the active region 240 and the device isolation region 250 are simultaneously etched using a mask that includes a light transmissive region (i.e., B region) and the remaining shield regions other than the region B, such that the gate electrode pattern 285 is formed. As a result, the gate electrode pattern 285 and the junction (drain region) do not overlap with each other, the depth for forming such a junction can be adjusted, there is less GIDL, and leakage generation between the device isolation region 250 and the junction can be prevented.

Referring to FIG. 6, upon completion of the process of FIG. 2D, the gate electrode material is etched using the mask 205 of FIG. 6 as an etch mask, such that the gate electrode pattern 285 is formed as shown in FIG. 2E(iii) (See the light transmissive region (C region) in the mask of FIG. 6). Preferably, the gate electrode material in the active region 240 may be etched to form the gate electrode pattern 285, and another gate electrode material in the device isolation region 250 may be completely etched.

As apparent from the above description, the semiconductor device and a method for manufacturing the same according to embodiments of the present invention can form a gate electrode material only in a recess of a buried gate cell structure, lower Gate Induced Drain Leakage (GIDL) between a gate electrode material and a junction (i.e., drain region), prevent the gate electrode material from overlapping with the junction (i.e., drain region), and adjust the depth of junction.

The above embodiments of the present invention are illustrative and not limitative. Various alternatives and equivalents are possible. The invention is not limited by the type of deposition, etching, polishing, and patterning steps described herein. Nor is the invention limited to any specific type of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A semiconductor device comprising:
   a device isolation region defining an active region over a semiconductor substrate;
   a first gate trench in the active region, the first gate trench having a first side proximate to a source region and a second side proximate to a drain region;
   a gate insulating layer over a surface of the first gate trench;
   a first gate pattern disposed over the gate insulating layer that is disposed over the first gate trench, the first gate pattern being disposed at the first side; and
   a capping layer disposed over the gate insulating layer that is disposed over the first gate trench, the capping layer being disposed at the second side,
   wherein the first gate pattern and the capping layer are symmetrical to each other.

2. The semiconductor device according to claim 1, wherein the capping layer includes a polymer.

3. The semiconductor device according to claim 1, wherein the capping layer includes an oxide film or a nitride film.

4. The semiconductor device according to claim 1, wherein the first gate pattern includes any of aluminum (Al), tungsten (W), tungsten nitride (WN), titanium (Ti), titanium nitride (TiN) and a combination thereof.

5. The semiconductor device according to claim 1, wherein the source region is coupled to a bit line contact, and the drain region is coupled to a storage node contact.

6. The semiconductor device according to claim 1, further comprising:
   a second gate trench disposed in the device isolation region; and
   a second gate pattern disposed in a lower portion of the second gate trench.

7. A semiconductor device, comprising:
   a device isolation region defining an active region;
   a first gate trench disposed in the active region, the first gate trench having a first side proximate to a source region and a second side proximate to a drain region;
   a gate insulating layer disposed over a surface of the first gate trench;
   a first gate pattern disposed over the gate insulating layer at the first side;

a capping layer disposed over the gate insulating layer at the second side and under the first gate pattern;
a second gate trench disposed in the device isolation region; and
a second gate pattern disposed in a lower portion of the second gate trench.

8. The semiconductor device according to claim 7, further comprising:
a third gate pattern disposed over the second gate pattern in an upper portion of the second gate trench.

9. A semiconductor device, comprising:
a device isolation region defining an active region;
a gate trench disposed in the active region;
a gate insulating layer disposed over a surface of the gate trench;
a first capping layer disposed over the gate insulating layer in a lower portion of the gate trench;
a gate pattern disposed over the first capping layer; and
a second capping layer disposed over the first capping layer and disposed between the gate insulating layer and the gate pattern.

10. A semiconductor device, comprising:
a device isolation region defining an active region;
a first gate trench disposed in the active region;
a gate insulating layer disposed over a surface of the first gate trench;
a first capping layer disposed over the gate insulating layer in a lower portion of the first gate trench;
a first gate pattern disposed over the first capping layer;
a second gate trench disposed in the device isolation region; and
a second gate pattern disposed in a lower portion of the second gate trench.

11. The semiconductor device according to claim 10, further comprising:
a third gate pattern disposed over the second gate pattern in an upper portion of the second gate trench.

* * * * *